United States Patent [19]

Shiotani et al.

[11] Patent Number: 5,297,243
[45] Date of Patent: Mar. 22, 1994

[54] CUTOUT MASK PRODUCTION APPARATUS AND METHOD

[75] Inventors: Masato Shiotani; Makoto Kitaura, both of Kyoto, Japan

[73] Assignee: Dainippon Screen Mfg. Co., Ltd., Kyoto, Japan

[21] Appl. No.: 754,801

[22] Filed: Sep. 4, 1991

[30] Foreign Application Priority Data

Sep. 10, 1990 [JP] Japan .................. 2-241478

[51] Int. Cl.⁵ .................. G06K 9/46; H04N 1/38; H04N 5/65
[52] U.S. Cl. .................. 395/135; 395/117; 382/16; 382/33; 382/49
[58] Field of Search .................. 395/111, 117, 135, 103; 382/48; 358/22; 354/120, 121, 122, 123, 124, 125; 430/5; 364/525; 355/73, 125

[56] References Cited

U.S. PATENT DOCUMENTS

| | | | |
|---|---|---|---|
| 4,514,767 | 4/1985 | Kubota et al. | 358/280 |
| 4,583,125 | 4/1986 | Yamada | 358/284 |
| 4,704,927 | 11/1987 | Hirosawa | 83/13 |
| 4,884,224 | 11/1989 | Hirosawa | 364/550 |
| 5,038,383 | 8/1991 | Usumoto et al. | 382/16 |
| 5,091,967 | 2/1992 | Ohsawa | 382/22 |

Primary Examiner—Dale M. Shaw
Assistant Examiner—Jeffrey J. Bonasso
Attorney, Agent, or Firm—Lowe, Price, LeBlanc & Becker

[57] ABSTRACT

This invention relates to the production of cutout masks used in a reproduction process. The cutout mask production apparatus and method according to the present invention allows both the layer process and the choke and spread process to be independently implemented. In the choke and spread process, frame drawings 92 which need no choke and spread are left intact, while other frame drawings 93 to be choke-and-spread processed are manipulated for the processing. As a result, the choke and spread process and the layer process can be implemented in a simple and quick manner. As each layer containing one or more frame drawings is painted in its assigned color on the monitor screen 22, the layer process becomes simple. Accordingly, the cutout mask production productivity improves.

4 Claims, 11 Drawing Sheets

FIG. 5D

| DRAWING TOOL PALETTE | NEW | | | EDIT | | |
|---|---|---|---|---|---|---|
| | □ | ○ | / | MOVE | RO-TATE | COPY |
| | ⬭ | ▱ | ⌒ | | | |
| | | | | | | |
| | | | | | | |
| | | | | | | |

| MODE 1 | MODE 2 | MODE 3 | MODE 4 | | X | Y |
|---|---|---|---|---|---|---|
| 7 | 8 | 9 | | | | |
| 4 | 5 | 6 | | | | |
| 1 | 2 | 3 | | | | |
| 0 | + | - | | | QUIT | |

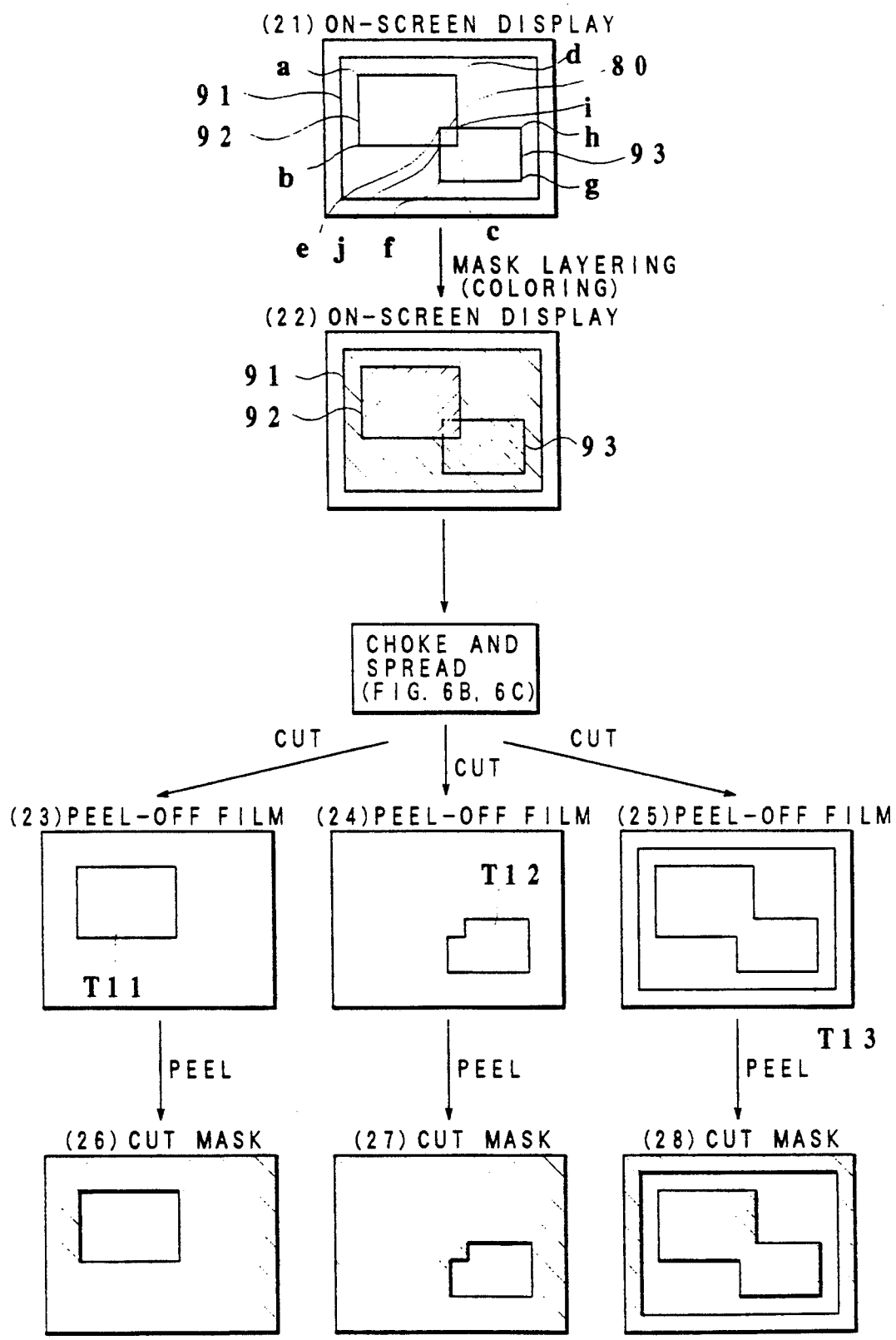

CUTOUT MASK PRODUCTION APPARATUS AND METHOD

BACKGROUND OF THE INVENTION AND RELATED ART STATEMENT

1. Field oft he invention

This invention relates to the production of cutout masks used in a reproduction process. In particular, the present invention relates to a layer process in the production of cutout masks.

2. Description of the Prior Art

Cutout masks are commonly used to produce process films in the reproduction process. The cutout masks are produced from processing peel-off films. The peel-off films are transparent (light-transmitting) film substrates with a coating of colored (typically red) light-shielding films. The light-shielding films are cut in a pattern, and any film area (peel portion) closed by the pattern may be peeled off, exposing transparent film substrates.

Assuming that a reproduction process starts with a mechanical 156 showing FIGS. 150 overlaps with FIGS. 151 and that a back ground 158 surrounds FIGS. 150 and 151, in FIG. 1A, the entire process to process films is as follows: First, peel-off films are so cut that peel portions are outlined as indicated in FIG. 1B and FIG. 1C. The peel portions are then peeled off, resulting in a cutout mask 152 in FIG. 1B and another cutout mask 153 in FIG. 1C. Original films 154 and 155, bearing FIGS. 150 and 151 respectively, are attached onto both cutout masks 152 and 153 so that their transparent portions 152a and 153a are correspondingly covered as shown in FIG. 1D and FIG. 1E. The cutout mask 152 is further attached onto a process film (not shown), and then an exposure step is taken. The process film is exposed through the FIG. 150, thereby in accordance with its location and patterns, wherein the location and patterns fall in the transparent portion 152a. The cutout mask 152 shown in FIG. 1D is then replaced with another cutout mask 153 shown in FIG. 1E. The process film is again exposed through the FIG. 151, thereby in accordance with its locations and patterns, wherein the location and patterns fall within the transparent portion 153a. As a result, the process film now bears both FIGS. 150 and 151 as shown in FIG. 1A.

Further to the above description, more detail description is given below on how both cutout masks 152 and 153 (see FIG. 1B and FIG. 1C) are produced from the mechanical 156 shown in FIG. 1A. Used in the cutout mask production process are a digitizer 20 (See FIG. 5A), a computer 21, a monitor 22, a keyboard 23 (See FIG. 5B) and a cutting plotter 26 (see FIG. 5C).

FIG. 2A shows a first prior art example of the cutout mask production. Presented on the screen of the monitor 22 (see FIG. 5B) are two frame drawings of the FIGS. 150 and 151 shown in FIG. 1A within them as shown in FIG. 2A(1). One frame drawing overlaps with the other frame drawing, forming a overlapping portion 80. Note that the two frame drawings are drawn, based on the graphic data derived from the digitizer 20 (see FIG. 5A). Similarly, the frame drawing of the entire mechanical 156 is presented on the screen.

Next step is to cut a set of the predetermined number of peel-off films according to the graphic data which are graphically presented on the monitor screen. In this case, a set of three peel-off films as shown in (2), (3) and (4) of FIG. 2A are prepared and cut in the same pattern. The cutting plotter 26 performs the cutting step according to a signal from the computer 21. Referring to FIG. 5C, a cutting head 26C of the cutting plotter 26 cuts a peel-off film 30 set up on the cutting plotter 26.

The cut peel-off films, (2), (3) and (4), are then transferred to a factory peeling crew. The crew peel off the peel-off films, completing the cutout mask production step. It should be noted that each of peel-off films, (2), (3) and (4), has peel portions of T1, T2, T3, T4 and T5, all in common (see the peel-off film in FIG. 2A(1)). The crew have to determine what combination of peel portions to peel, referring to how frame drawings are overlapped in the mechanical 156 shown in FIG. 1A. In FIG. 2A (5), (6), and (7), hatching represents light-shielding portions and the blanks represent transparent (peel) portions. The cutout mask (5) is obtained by peeling the peel portion T5 off the peel-off film (2), and the cutout mask (6) is obtained by peeling the peel portions T3 and T4 off the peel-off film (3). The cutout mask (7) is obtained by peeling the peel portion T2 off the peel-off film (4). The cutout mask (7) is a film used to expose the process film for the background portion 158 (see FIG. 1) surrounding the FIGS. 150 and 151 in the mechanical 156.

Next step is to perform a choke and spread process to the cutout masks (5) and (7). The choke and spread process is to avoid in prints blanked borders which are due to a misaligned setup, likely to happen in the reproduction process. For example, when a misalignment takes place between the cutout masks (5) and (7) in FIG. 2A, a blank line may be created on the border 159 where the FIG. 150 and the FIG. 151 meet as in FIG. 1A. As choke and spread offset means for avoiding such a blank line, a transparent portion 82 on the cutout mask (5) is slightly enlarged so that its edge spreads over a transparent portion 83 on the cutout mask (6), when both cutout masks are set up. In the same manner as above, the choke and spread process is performed to the cutout mask (7) so that no blanked borders take place where the background portion 158 meets either the FIG. 150 or the FIG. 151. The width of enlarging the transparent portions is normally 50 $\mu$m to 75 $\mu$m. Such a degree of spread width in figures is too small to be noticed; thus, the choke and spread process will never affect the sharpness of prints.

In this prior art example, the choke and spread process adopts a reversing technique as illustrated in FIG. 2B. A cutout mask 70, a diffusion film 72, and a process film 74 to be choke-and-spread processed are stacked in a sandwich construction. The diffusion film 72 is of a film type that allows light to diffusively transmit. To perform the choke and spread process, light is directed to a transparent portion 70a of the cutout mask 70 in the direction of an arrow mark 100. The process film 74 is exposed to light which has passed the transparent portion 70a and then the diffusion film 72 in a diffusive manner. As a result, the choke and spread process has completed to the process film 74, with its transparent portion 74a being slightly larger than the transparent portion 70a of the cutout mask 70.

Referring to FIG. 3A, a second prior art example of producing the cutout masks 152 and 153 (see FIG. 1B and FIG. 1C) is described below. In a similar manner as in the first prior art, a display (8) is presented on the screen of the monitor 22 by means of the digitizer 20 (see FIG. 5A and FIG. 5B). The display (8) is made up of a first frame drawing 91, a second frame drawing 92, and a third frame drawing 93. The first frame drawing 91 shows the outline of the entire mechanical 156 in FIG. 1A. The second frame drawing 92 shows a frame of the FIG. 150, and the third frame drawing 93 shows another frame of the FIG. 151. The second frame drawing 92 overlaps with the third frame drawing 93, making the overlapping portion 80.

In this prior art example, the frame drawings are grouped to produce a required number of mask layers on the screen of the monitor 22. The choke and spread process is also performed along with this grouping step. More specifically, the frame drawings are once stored, and then the choke and spread process is performed by enlarging the portion T5 derived from excluding the overlapping portion 80 from the third frame drawing 93 on the screen of the monitor 22 as shown in FIG. 3A(9) and FIG. 3A(12). FIG. 3B is a detail drawing of display (9). A first step of the choke and spread process is to contract the second frame drawing 92. The contracted drawing is here designated 92X. A point P6 is one of the frame drawing 92X's corners which falls in the overlapping portion. A point P1 is the intersecting point where the frame drawing 92X meets the top side of the third frame drawing 93. A point P2 is the intersecting point where the frame drawing 92X meets the right side of the third frame drawing 93. A next step is to select a spread drawing for the choke and spread process. The spread drawing (see FIG. 3A(12)) here is a closed area formed by connecting the corner P6, points P1, P2 and three corners P3, P4 and P5, of the third frame drawing 93. After that, the first frame drawing 91, the second frame drawing 92, and the contracted frame drawing 92X are then all erased.

Next, the layer process starts with the display (10) in FIG. 3A. Both the first frame drawing 91 and the third frame drawing 93 should be first erased. This step is to produce the mask layer bearing the second frame drawing 92 only as illustrated in display (13).

Furthermore, another mask layer as in the display (14) is produced which corresponds to the background portion 158 in FIG. 1A. The choke and spread process of this mask is performed by combining the first frame drawing 91 and the second frame drawing 92 to form a frame drawing 94 as in display (11) of FIG. 3A, and then by contracting the frame drawing 94. A display (14) shows the contracted frame drawing 90N, which is already choke-and-spread processed. A digitizer input device 20M on the digitizer 20 is used to instruct graphic commands, like selecting, enlarging, or contracting drawings.

As mentioned above, three mask layers, shown in the display (12), the display (13) and the display (14), have been produced, through the mask grouping procedure based on the graphic data in the display (8), in FIG. 3A. These mask layer data are used to cut peel-off films, leading to the peel-off films (15), (16) and (17) in FIG. 3A. The peel-off films are then handed over to peeling crew who then peel off the peel portion T6, T7 or T8. The cutout masks (18), (19) and (20) have now been produced.

The prior art cutout mask production techniques, however, involve the following problems. In the first prior art example, the cutting patterns on the peel-off films (2), (3) and (4), are identical as shown in FIG. 2A. Thus, peeling crew have to determine what peel portions to peel and group mask layers for each final cutout mask. In case of FIG. 1F where a mechanical is composed of many overlapped figures, many combinations of figures are expected in a single mask layer. It is rather difficult to make a judgement in combining figures keeping the number of masks to a minimum. Peeling crew thus need long and experienced skill. Since peeling crew unavoidably have their own characteristics or preference in peeling work, they fail to produce cutout masks up to an established standard, and thus the integration and standardization of the peeling work cannot be reached. Also, when a cutout mask needs modifying after its full process of production, for example, the modification work should be done by the same crew who peeled off that cutout mask rather than some other crew. Furthermore, the first prior art example employs the reversing technique for the choke and spread process as illustrated in FIG. 2B. This technique allows the spread width to vary dependent on the exposure time in use. To reach the spread width, data on exposure or other related controls should be strictly managed. Such otherwise unnecessary management items are problematic from the viewpoint of quality assurance of cutout masks.

In the second prior art example, layering is performed by grouping drawings on the screen of the monitor 22. Each peel-off film has different cutting pattern for desired mask. Unlike the first prior art example, there is no need for peeling crew to determine which portions to peel off. Since the choke and spread process is performed along with the layer process on the screen, no reversing step as in the first example is required. This allows spread width to be set in a secure manner.

On the other hand, the second example has following disadvantages. When the third frame drawing 93 is in the choke and spread process as in FIG. 3B, the second frame drawing 92 needs contracting first. This means that a drawing itself which does not need choke and spread process should be graphically manipulated taking into consideration its spatial relationship with other drawings. Such an additional manipulation affects low productivity. In case of FIG. 1F where a mechanical is composed of many overlapped figures, spatial relationships among them are very complex. Even more time is needed. In the second example, the layer process is performed on the screen of the monitor. Therefore, when spatial relationships in figures are complex, it is not easy to determine, referring to displays on screen, which combination of figures gives which required mask. The layering task is thus a time consuming one. Since the layer process is associated with the choke and spread process, the overall task is even more complex.

SUMMARY OF THE INVENTION

The present invention provides a high-productivity cutout mask production method which allows both a choke and spread process and a layer process to be performed in a simple and quick manner.

A cutout mask production instrument comprises:

a device for reading the information of locations and frames of a plurality of closed areas such as characters, figures within a print peel-off film, referring to a mechanical;

a first storage device for storing the read information;

grouping means for grouping said plurality of closed areas into a plurality of grouped areas, referring to the mechanical;

a second storage device for storing the information of locations and frames of grouped areas, within the same print peel-off film;

a monitor screen, wherein the monitor screen presents the information of locations and frames a plurality of closed areas such as characters, figures referring to the mechanical;

choke and spread means for spreading the bordering side of one grouped area over other grouped area by a predetermined amount, wherein both grouped areas, stored in said second storage device, belong to two different groups, but have common borders;

a third storage device for storing the information of locations and frames of grouped areas which are choke-and-spread processed, within the same print peel-off film; and a cutting device for cutting print peel-off films in accordance with the locations and the frames of grouped areas, which are choke-and-spread processed, within the same print peel-off film, according to the information stored in said third storage device.

A cutout mask production method comprises steps of:

reading the information of locations and frames of a plurality of closed areas such as characters, figures within a print peel-off film, referring to a mechanical and then for transferring said information to a first storage device and a monitor;

grouping said plurality of closed areas into a plurality of grouped areas, referring to said mechanical and said monitor;

storing, into a second storage device, the information of locations and frames of grouped areas, within the same print peel-off film;

spreading the bordering side of one grouped area over other grouped area by a predetermined amount, wherein both grouped areas, stored in said second storage device, belong to two different groups, but have common borders, referring to said mechanical and said monitor;

storing, into a third storage device, the information of locations and frames of grouped areas which are choke-and-spread processed, within the same print peel-off film;

cutting print peel-off films in accordance with the locations and the frames of grouped areas, which are choke-and-spread processed, within the same print peel-off film, according to the information stored in said third storage device;

peeling said grouped areas off each of print peel-off films which are already cut, according to each cutting pattern.

While the novel features of the invention are set forth in a general fashion, particularly in the appended claims, the invention, both as to organization and content, will be better understood and appreciated, along with other objects and features thereof, from the following detailed description taken in conjunction with the drawings.

BRIEF DESCRIPTION OF THE DRAWINGS

FIG. 5D shows an example of a menu keypad;

FIG. 6A is a flowchart showing a series of steps in the embodiment of the cutout mask production method according to the present invention;

DETAILED DESCRIPTION OF THE PREFERRED EMBODIMENTS OF THE INVENTION

Figure 5C:
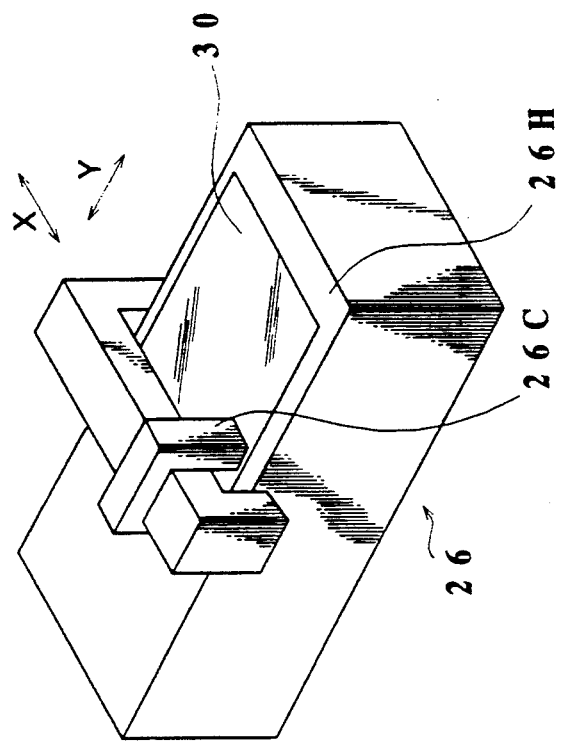
FIG. 5A, FIG. 5B and FIG. 5C is a perspective view showing the system in the embodiment of the cutout mask production method according to the present invention.
Figure 5B:
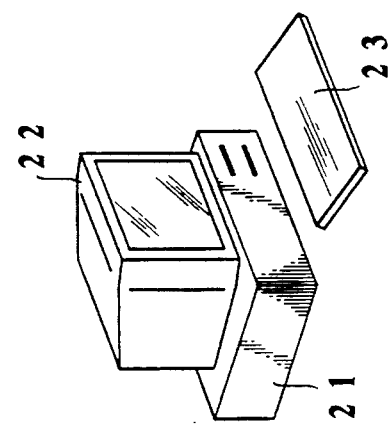
Figure 5A:
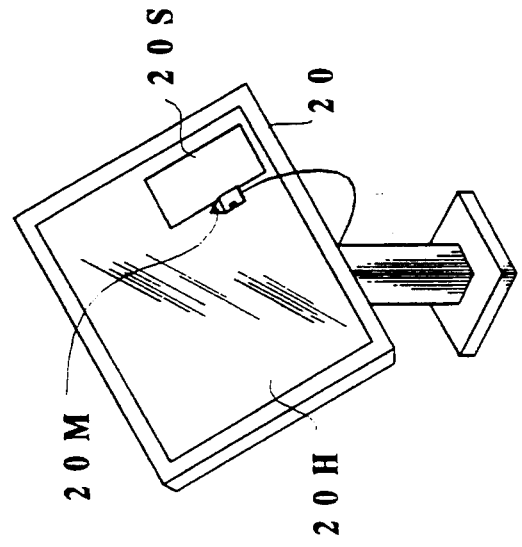

Referring to the drawings, an embodiment of the cutout mask production method according to the present invention is described below. FIG 5A, FIG. 5B and FIG. 5C shows the system used in the cutout mask production. A computer 21 receives the graphic data which a digitizer 20 generates and feeds. Based on the graphic data, a monitor 22 present drawings on its screen. According to an instruction from the computer 21, a cutting plotter 26 cuts a peel-off film 30 on it.

Figure 4:
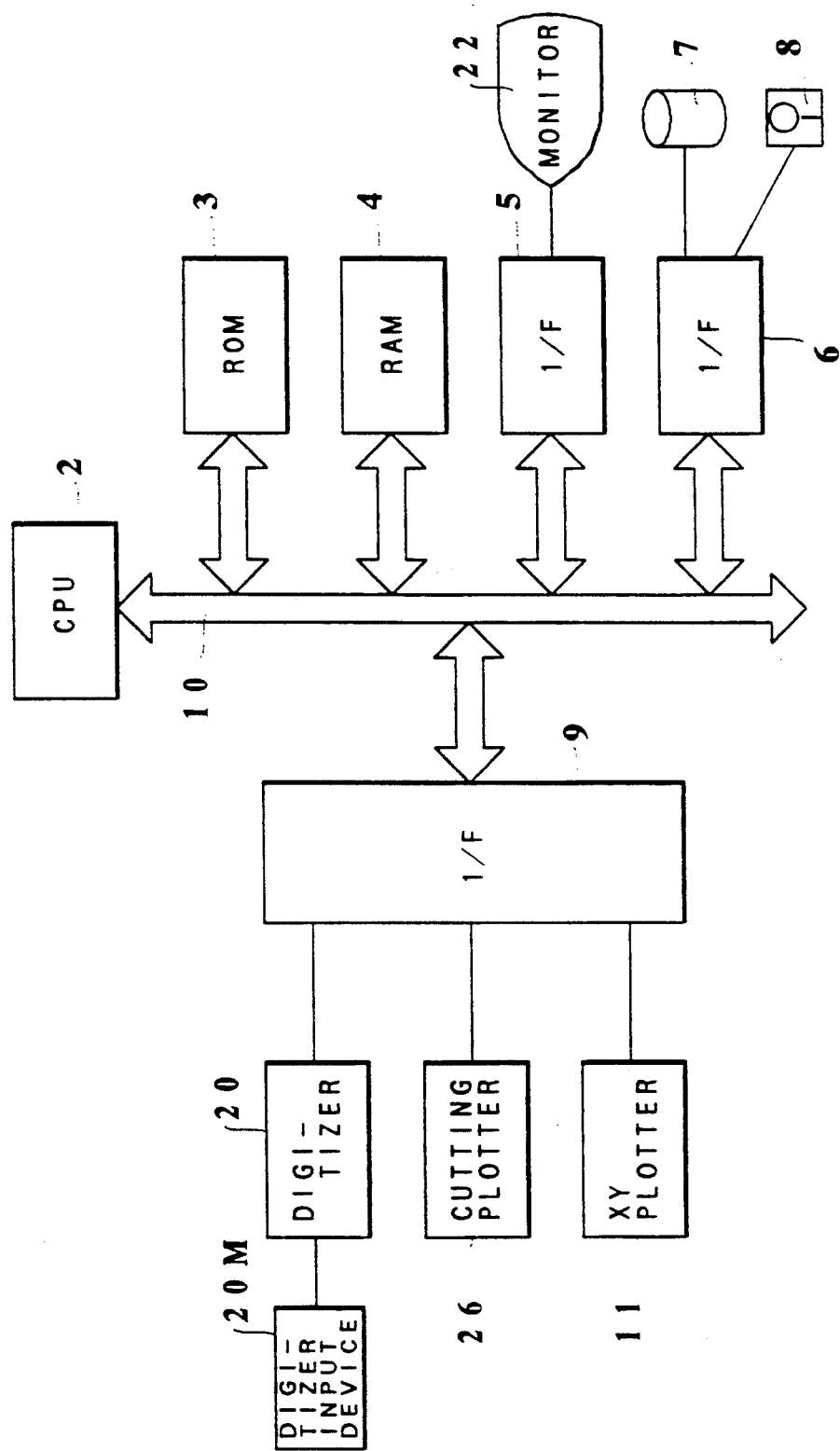
FIG. 4 is a hardware block diagram showing a system in an embodiment of the cutout mask production method according to the present invention.

FIG. 4 is a hardware block diagram of the system in this embodiment. Connected to a bus line 10 are a ROM 3 and a RAM 4 functioning as the above mentioned first, second and third storage devices. A CPU 2 retrieves a program stored in the ROM 3 via the bus line 10, in order to control associated devices. Also connected to the bus line 10 are a monitor 22 via an interface 5, and a hard disk 7 or a floppy disk 8 via an interface 6. The bus line 10 is further connected to an interface 9 which, in turn, connects to the digitizer 20, the cutting plotter 26, and an XY plotter 11. The XY plotter 11 serves as a testing machine which is used to plot each cutting pattern before it is really used on the cutting plotter 26. This provides a chance of judging the appropriateness of the cutting pattern in a test plotting before real cutting operation is performed on the peel-off film 30.

Described below is the steps of the cutout mask production, using the mechanical 156 shown in FIG. 1A. The mechanical 156 contains, as its original information, a FIG. 150 (made up of the location and frame information of its closed area), and a FIG. 151 (made up of the location and frame information of its closed area). Noted that closed area means entire area on which characters, figures or the like is drawn. Letters (or something like that) which indicate a closed area may work instead of a closed area graphically drawn. The mechanical may be layout instructions or rough sketches of something to be printed.

The digitizer input device 20M of the digitizer 20 shown in FIG. 5A is used to read out graphic data of the location and the frame drawings of both the FIG. 150 and the FIG. 151. More specifically, the mechanical 156 is placed on a input surface 20H of the digitizer 20, and the frame drawings of the FIGS. 150 and 151 are selected using the digitizer input device 20M. The graphic data read is stored in the RAM 4 via the interface 9 according to a command from the CPU 2. The graphic data is transferred via the interface 5 to the monitor 22 where the data is graphically presented on the monitor's screen (see FIG. 4).

The input surface 20H is associated with a menu keypad 20S. FIG. 5D shows an example of the menu keypad 20S. Any desired mode of operation is selected on the digitizer input device 20M, using the menu keypad 20S, and a command corresponding to that mode is transmitted to the CPU 2. Inputting graphic data is easily carried out by choosing a desired tool from a drawing tool palette 260.

The graphic data thus entered is stored, while it is graphically presented on the screen as shown in FIG. 6A(21). The screen presents a first frame drawing 91, a second frame drawing 92, and a third frame drawing 93. The first frame drawing 91 is an outline of the entire mechanical 156 shown in FIG. 1A. The second frame drawing 92 shows a frame of the FIG. 150 and the third frame drawing 93 shows another frame of the FIG. 151. The second frame drawing 92 overlaps with the third frame drawing 93, causing an overlapping portion 80.

Next, each drawing needs coloring and layering. The layer process is described in detail below.

Figure 1A:
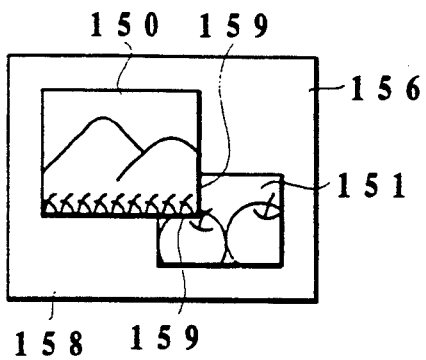
FIG. 1A, FIG. 1B, FIG. 1C, FIG. 1D, FIG. 1E and FIG. 1F depict general process film making process.
Figure 1B:
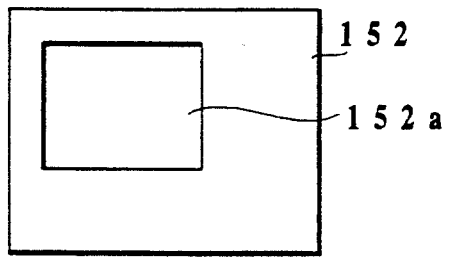
Figure 1C:
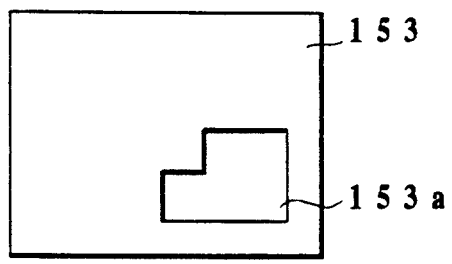
Figure 1D:
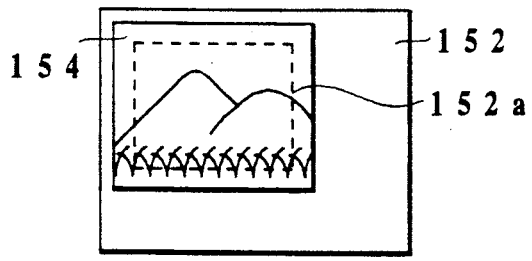
Figure 1E:
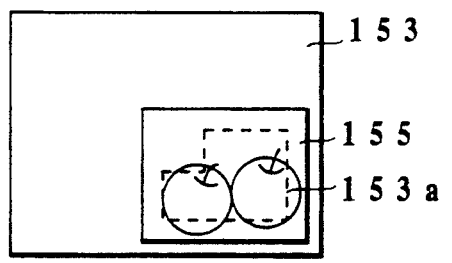

From the mechanical 156 in FIG. 1A, an operator first sees that the second frame drawing 92 overlaps with the third frame drawing 93, and then produces, on the screen, mask layers showing that the third frame drawing 93 is partly hidden beneath the second frame drawing 92. More specifically, to produce a mask for the second frame drawing 92, mode 1 should be chosen on the digitizer input device 20M of the digitizer 20, using a mode selector 262 on the menu keypad 20S. Receiving a command from the digitizer 20 via an interface 9, the CPU 2 recognizes the selection of the mode 1. The mode 1 is used to select any frame drawing that should come in front rather than in back of other frame drawings in the overlapping order, when several frame drawings are overlapped.

Using again the digitizer input device 20M, the FIG. 92 displayed on screen is selected. According to the function of the mode 1, the CPU 2 then extracts a closed area surrounded by points a, b, c and d from graphic data stored in the RAM 4. These graphic data extracted are grouped and designated group 1 on a grouped area or a first layer, and then stored back in the RAM 4. Along with this storage operation, the CPU 2 commands the monitor 22 to graphically present the graphic data in a predetermined color on screen via an interface 5. It means that an on-screen area corresponding to the graphic data stored as group 1 is colored. Each layer is assigned its own color, and the RAM 4 stores this color assignment table. See Table 1 below.

TABLE 1

| First layer | Group 1 | Yellow |
|---|---|---|
| Second layer | Group 2 | Blue |
| Third layer | Group 3 | Red |
| fourth layer | Group 4 | Green |
| . | . | . |
| . | . | . |
| . | . | . |

Each layer can be reassigned color, if necessary. In this embodiment, the first layer is assigned yellow.

Suppose a grouped area or a second layer is now produced for the third frame drawing 93, after the second frame drawing 92 has been registered in the first layer as above. Mode 2 should be first chosen using the mode selector 262 on the menu keypad 20S. The mode 2 is used to select any frame drawing that comes in back of another drawing in the overlapping order, when several frame drawings are overlapped.

Using the digitizer input device 20M, the frame drawing 93 on screen is selected. According to the function of the mode 2, the CPU 2 then extracts the smallest closed area of the third drawing 93, that is a graphic area surrounded by points i, c, j, f, g, and h from the graphic data stored in the RAM 4. These graphic data extracted are grouped and designated group 2 on the second layer, and then stored back in the RAM 4. Along with this storage operation, the CPU 2 commands the monitor 22 to graphically present the graphic data in a predetermined color on screen via the interface 5. As a result, the on-screen closed area having corners i, c, j, f, g, and h is painted blue (see Table 1).

Similarly, the outline composed of the first frame drawing 91, and the second frame drawing 92 and the third frame drawing 93 are stored as group 3 on a grouped area or a third layer in the RAM 4. In a mode 3 on the menu keypad 20S, the CPU 2 then extracts the outline (largest closed area) formed by the second frame drawing 92 plus the third frame drawing 93 from graphic data stored in the RAM 4,. A single layer can contain a plurality of frame drawings in other word, these frame drawings can be stored in the same group. In this case, all drawings on the same layer are painted in the same color on screen.

Figure 1F:
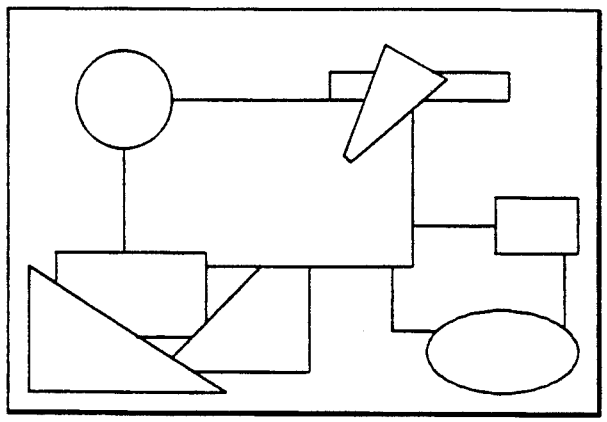
Figure 2A:
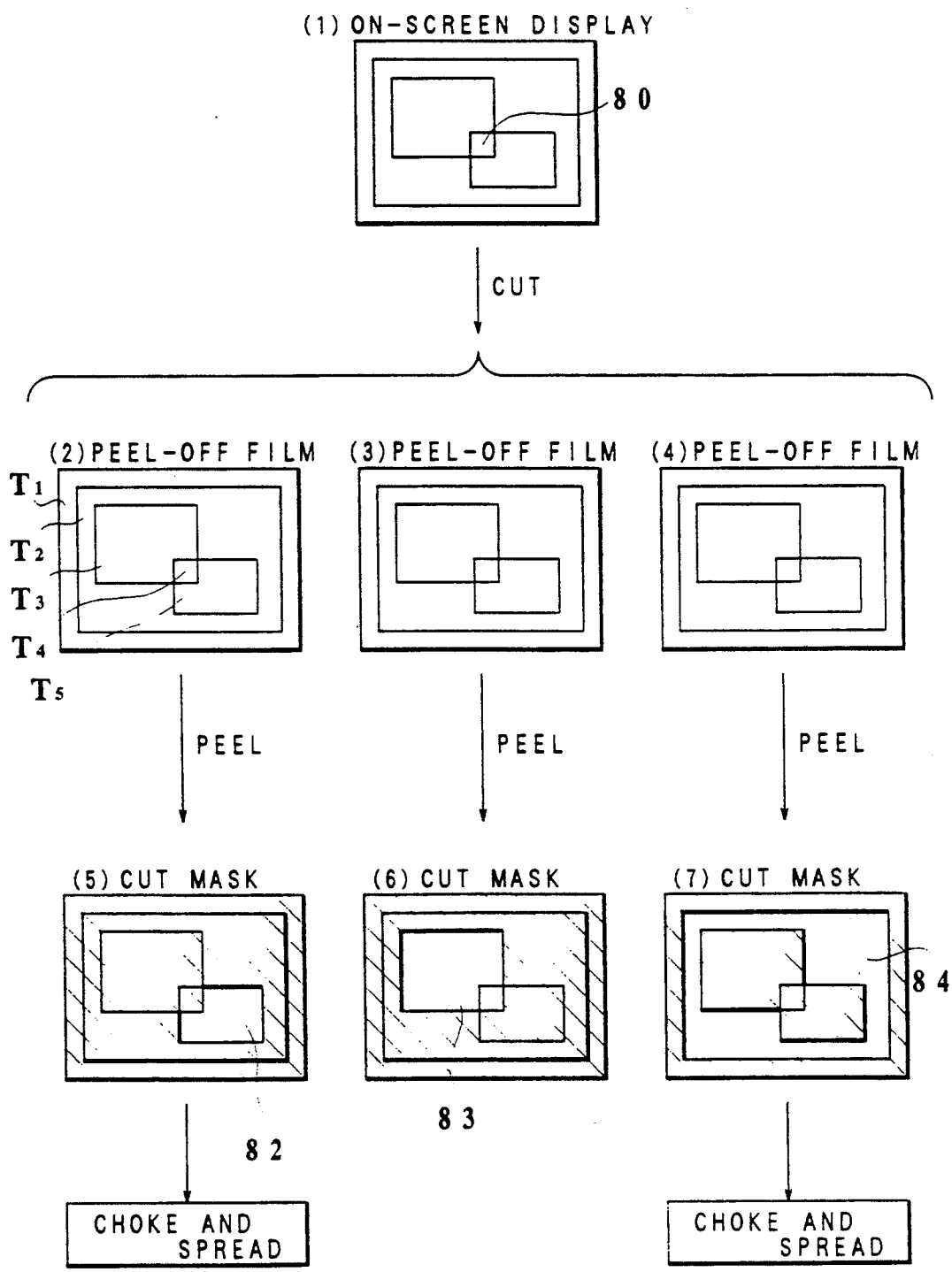
FIG. 2A is a flowchart showing a series of steps in the first prior art cutout mask production method.
Figure 2B:
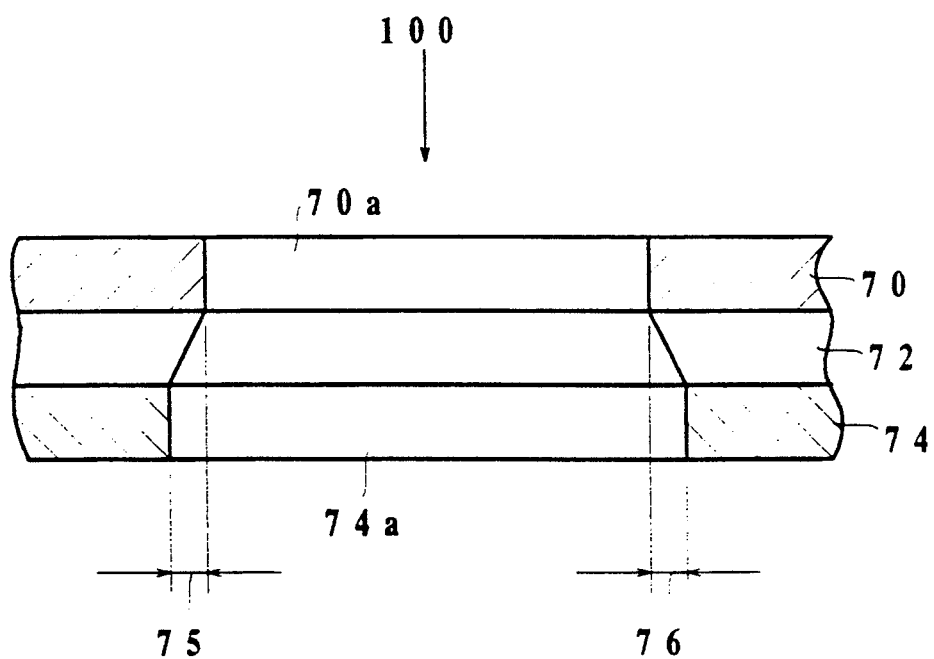
FIG. 2B is a cross-sectional view showing how the choke and spread is processed in the first prior art cutout mask production method.
Figure 3A:
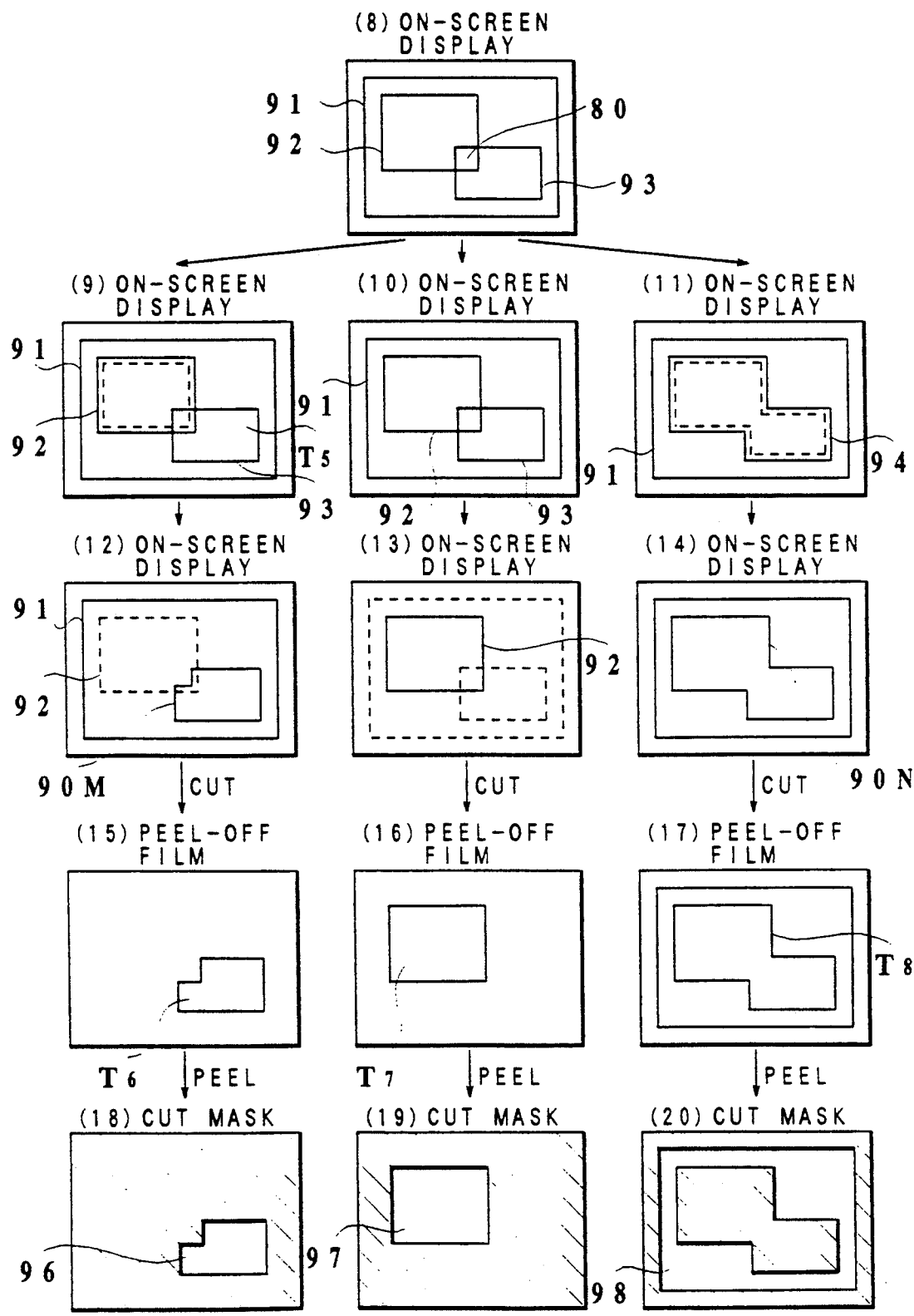
FIG. 3A is a flowchart showing a series of steps in the second, prior art cutout mask production method.
Figure 3B:
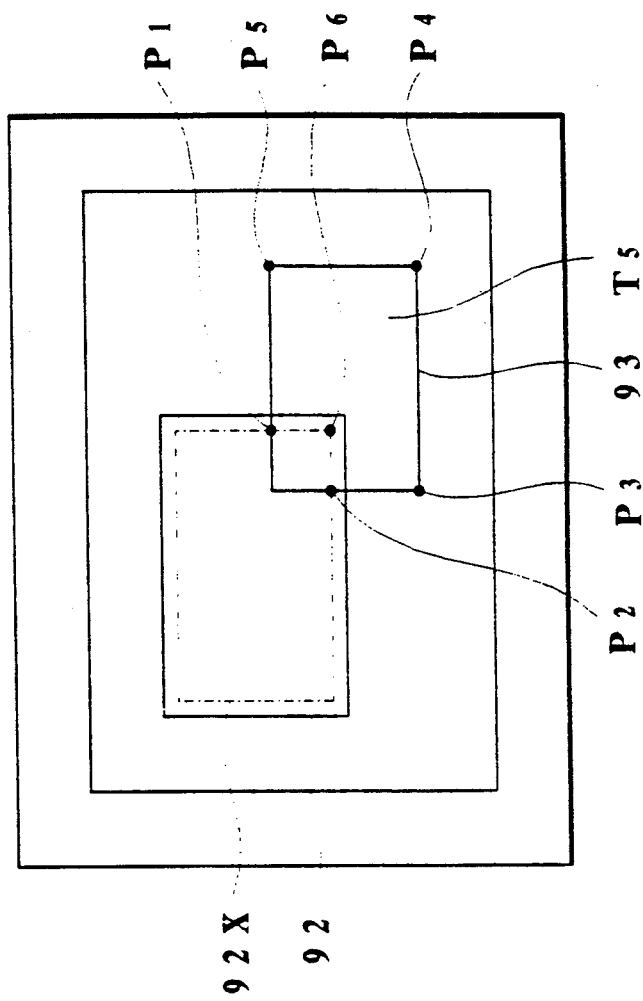
FIG. 3B is a view showing how the choke and spread is processed in the second prior art cutout mask production method.

As above mentioned, the monitor screen gives color presentation like the one shown in FIG. 6A(22). The color presentation allows the operator to visually recognize the completion of the mask layering which exactly keeps spatial relationships of drawings in the mechanical 156 (see FIG. 1A). In case of FIG. 1F where a mechanical is composed of many overlapped figures, layering must be performed so that one drawing is not located too closely with another in the same layer. According to the present invention, one layer is assigned a common color, thereby clearly presenting spatial relationships of drawings. The layering efficiency thus improves.

The sequence in which the drawings are selected for the layer process may be used to identify the overlapping order. Suppose a drawing selected later has a priority over the previously selected one. Under such a rule established, if you select the drawings, one by one, from the bottom to the top in the layer process, the same overlapping order as the mechanical duplicates. The CPU recognizes an overlapping portion where one drawing overlaps with another drawing which was previously selected, and stores graphic data of the previously selected drawing excluding the overlapping portion, into the RAM 4.

Figure 6B:
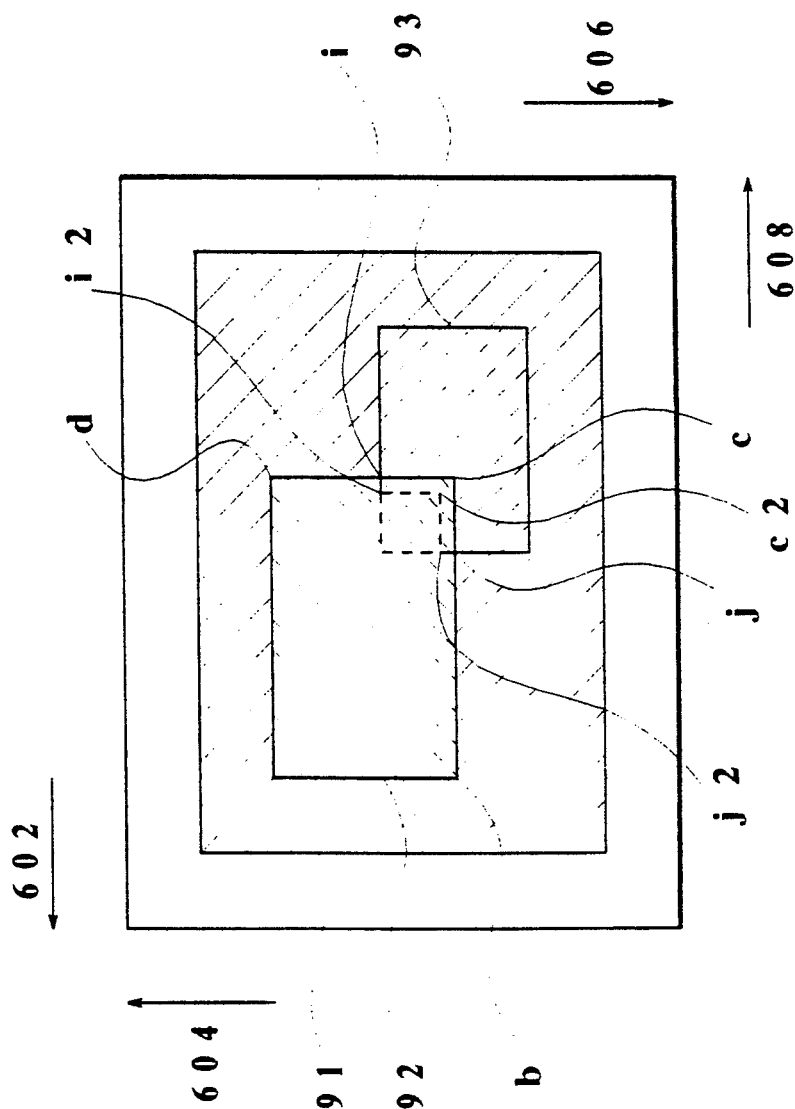
FIG. 6B and FIG. 6C are views showing the choke and spread process, which are included in steps in FIG. 6A.

In the present invention, the choke and spread process takes place, after the layer process. Both are independent processes. The choke and spread process is described in detail below. FIG. 6B is an enlarged view of a display (21) in FIG. 6A.

In FIG. 6B, a border line segment i-c is first moved in the direction of an arrow 602 by a specified distance. Similarly, another border line segment c-j is moved in the direction of an arrow 604 by a specified distance. The border line segments i-c and c-j thus intrude into the second frame drawing 92.

The actual operation of line segment movement is as follows: The border line segments, i-c and c-j, are selected using the digitizer input device 20M. Receiving this selection message via an interface 9, the CPU 2 reads the third frame drawing 93 stored in the group 2. Both direction and distance of the line segment movement are input via the keypad 20S. The direction input should be associated with plus sign (+), because the line segment movement takes place in a manner that the area of the third frame drawing 93 is getting larger. The distance input is made via numeric keys on the mode selector 262. Upon receiving direction and distance input, the CPU calculates and then moves both line segments c-i, and j-i to progress the choke and spread process. The CPU stores the third frame drawing 93 already choke-and-spread precessed back in the group 2. At the same time, the CPU commands the monitor 22 to present, on its screen, the third frame drawing 93 with the choke and spread processed.

It should be noted that the choke and spread process may be made by moving a border line segment d-c in the direction of an arrow 608 and by moving another border line segment c-b in the direction of an arrow 606. The choke and spread is normally made in such a manner that the edges of one figure spread over another figure which is darker than the first.

Figure 6C:
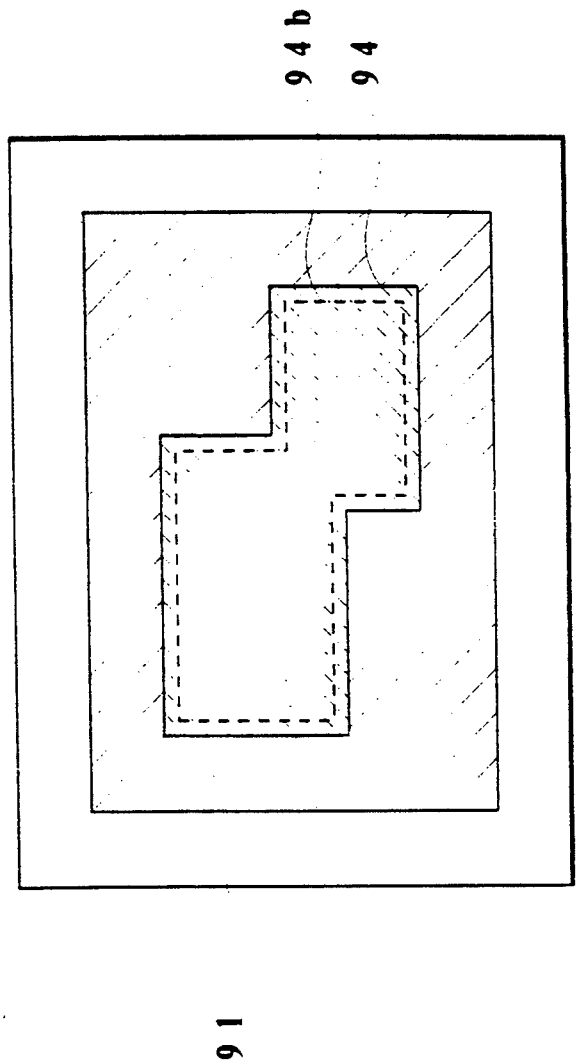

Referring to FIG. 6C, the choke and spread process for a frame drawing 94, the integrated area 94 of the second frame drawing 92 and the third frame drawing 93, is described below.

Each side of the frame drawing 94 is moved inwardly so that its area is shrunk. As already mentioned, the keypad 20S is used to instruct what side to move. It is also used to instruct how far and in what direction each edge is moved. The CPU calculates according to these instructions, and modifies graphic data stored in the group 3 in the RAM 4 to match the above shrinking. Modified graphic data are stored back in the group 3. At the same time, the monitor 22 presents a shrunk image 94b on its screen.

In the choke and spread process, the distance of movement of each side is mainly determined by the dot size on the printing surface. Therefore, once a desired direction and a desired distance are stored in the RAM 4, no modification is normally required afterwards. In this case, selecting a side to move is the only step needed in the choke and spread process. A quick choke and spread process thus results.

Next, the cutting plotter 26 (shown in FIG. 5C) is activated to cut three peel-off films. Peel-off films are set up on a work table 26H of the cutting plotter 26. When the cutting operation is initiated, the CPU instructs the cutting plotter 26 to start cutting, via the interface 9. The CPU 2 then accesses the RAM 4 to transfer graphic data to the cutting plotter 26 from the group 1, group 2, and then group 3 in succession.

Based on these data, the cutting plotter 26 carries out the cutting operation with its cutting head 26C. Each of the three peel-off films is cut in different pattern of corresponding mask layer's graphic data stored in the RAM 4. In the cutting operation, the cutting head is moved along the x axis. For a cutting along the y axis, the work table 26H instead moves. Before the real cutting operation by the cutting plotter 26, each cutting pattern may be plotted onto the XY plotter 11 (see FIG. 4) to preview it. It means that each layer's graphic data stored in the RAM 4 is transferred via the interface 9 to the XY plotter 11. A preview gives a chance of judging the appropriateness of the cutting patterns, thereby ensuring reliable cutting operation.

Peel-off films (23), (24), and (25) shown in FIG. 6A are those already cut. Peeling crew then peel off peel portions T11, T12, and T13 from peel-off films (23), (24) and (25) respectively. Cutout masks (26), (27), and (28) in FIG. 6A are the ones already peeled. In these figures, hatching represents light-shielding portions, and the blanks represent transparent portions. Cutout masks (26), (27), and (28) are resulting ones.

The cutout mask production method according to the present invention allows both the layer process and the choke and spread process to be independently implemented. In the choke and spread process, frame drawings which need no choke and spread are left intact, while other frame drawings to be choke-and-spread processed are manipulated for the processing. As a result, the choke and spread process and the layer process can be implemented in a simple and quick manner. The cutout mask production productivity thus improves.

Each layer containing one or more frame drawings is painted in its assigned color on the monitor screen. Such a visual presentation permits an easy grip of the layering situation. The layer process becomes simple.

The cutout mask production productivity improves thus even further.

Although the invention has been described in its preferred form with a certain degree of particularity, it is understood that the present disclosure of the preferred form has been changed in the details of its construction and any combination and arrangement of parts may be resorted to without departing from the spirit and the scope of the invention as hereinafter claimed.

What is claimed is:

1. A cutout mask production instrument comprising:
   a device for reading the information of locations and frames of a plurality of closed areas such as characters, figures within a print peel-off film, referring to a mechanical;
   a first storage device for storing the read information;
   grouping means for grouping said plurality of closed areas into a plurality of grouped areas, referring to the mechanical;
   a second storage device for storing the information of locations and frames of grouped areas, within the same print peel-off film;
   a monitor screen, wherein the monitor screen presents the information of locations and frames a plurality of closed areas such as characters, figures referring to the mechanical;
   choke and spread means for spreading the bordering side of one grouped area over another grouped area by a predetermined amount, wherein both grouped areas, stored in said second storage device, belong to two different groups, but have common borders;
   a third storage device for storing the information of locations and frames of grouped areas which are choke-and-spread processed, within the same print peel-off film; and
   a cutting device for cutting print peel-off films in accordance with the locations and the frames of grouped areas, which are choke-and-spread processed, within the same print peel-off film, according to the information stored in said third storage device.

2. A cutout mask production instrument as claimed in claim 1,
   wherein grouped areas, which said grouping means grouped into the same group, are painted in a common single color on the monitor screen in order to identify each group by color.

3. A cutout mask production method comprising steps of:

reading the information of locations and frames of a plurality of closed areas such as characters, figures within a print peel-off film, referring to a mechanical and then for transferring said information to a first storage device and a monitor;

grouping said plurality of closed areas into a plurality of grouped areas, referring to said mechanical and said monitor;

storing, into a second storage device, the information of locations and frames of grouped areas, within the same print peel-off film;

spreading the bordering side of one grouped area over another grouped area by a predetermined amount, wherein both grouped areas, stored in said second storage device, belong to two different groups, but have common borders, referring to said mechanical and said monitor;

storing, into a third storage device, the information of locations and frames of grouped areas which are choke-and-spread processed, within the same print peel-off film;

cutting print peel-off films in accordance with the locations and the frames of grouped areas, which are choke-and-spread processed, within the same print peel-off film, according to the information stored in said third storage device;

peeling said grouped areas off each of print peel-off films which are already cut, according to each cutting pattern.

4. A cutout mask production method as claimed in claim 3, wherein grouped areas, which said grouping means grouped into the same group, are painted in a common single color on the monitor screen in order to identify each group by color.

* * * * *